United States Patent

[11] 3,573,707

[72] Inventor Charles Edward Reynolds
Camp Hill, Pa.
[21] Appl. No. 855,648
[22] Filed Sept. 5, 1969
[45] Patented Apr. 6, 1971
[73] Assignee AMP Incorporated
Harrisburg, Pa.

[54] MOUNTING OF COMPONENTS ON METALLIC PRINTED CIRCUIT BOARDS
11 Claims, 7 Drawing Figs.

[52] U.S. Cl. .......... 339/17, 29/630, 174/68.5, 174/110.6, 339/275
[51] Int. Cl. .......... H01b 17/20, H05k 1/08
[50] Field of Search .......... 339/17, 217, 275; 29/625, 630; 174/68.5, 110.6, 178, (Inquired); 285/381; 165/173, 180

[56] References Cited
UNITED STATES PATENTS

| | | | |
|---|---|---|---|
| 2,027,962 | 1/1936 | Currie | 174/(110.6) |
| 2,915,678 | 12/1959 | Frazier | 339/17(C) |
| 3,266,821 | 8/1966 | Safford | 285/381X |
| 3,268,851 | 8/1966 | Mancini | 29/630(D) |
| 3,321,570 | 5/1967 | Webb | 339/17 |
| 3,504,328 | 3/1970 | Olsson | 339/17(C) |

*Primary Examiner*—Marvin A. Champion
*Assistant Examiner*—Terrell P. Lewis
*Attorneys*—Curtis, Morris and Safford, Marshall M. Holcombe, William Hintze, William J. Keating, Frederick W. Raring, John R. Hopkins, Adrian J. La Rue and Jay L. Seitchik

ABSTRACT: Component mounting system for metallic printed circuit boards having insulating coatings on their surfaces is disclosed in which the drilled hole in the metallic board is lined with a thin walled liner of plastic tubing. A metallic receptacle is positioned in the liner so that the liner electrically insulates the receptacle from the metallic portion of the printed circuit board. The lead wire from the component is inserted into the receptacle and the board is solder-dipped to electrically connect the lead wire to a connecting path on the board. The heat from the soldering operation causes the liner to radially expand so that it achieves a tight fit in the hole. The board acts as a heat sink for the components mounted thereon but the board is electrically isolated from the components excepting where it is used as a grounding plane.

Patented April 6, 1971

3,573,707

2 Sheets-Sheet 2

MOUNTING OF COMPONENTS ON METALLIC PRINTED CIRCUIT BOARDS

BACKGROUND OF THE INVENTION

Under some circumstances, it is desirable to use printed circuit boards composed of a thin aluminum panel having a thin coating of plastic on its surfaces, the conducting paths being provided on surfaces of the plastic. Boards of this type are used in critical applications and offer several advantages over conventional plastic circuit boards. One advantage is that the board itself can function as a heat sink thereby obviating the need for separate heat sinks for the individual components. Furthermore, metallic printed circuit boards are extremely durable and can be made to close dimensional tolerances.

Metallic printed circuit boards present a problem of forming connections between the lead wires from the individual components mounted on the board and the conducting paths on the board. If the conventional technique of simply drilling a hole through the board, inserting the lead wire through the hole, and soldering is used, the lead wires will all be electrically connected to the board itself. The possibility exists of soldering the lead wires directly to the paths on the printed circuit board rather than drilling holes through the boards, however, the drilling step is common practice in the printed circuit board art and offers several advantages which cannot be lightly ignored. Particularly, when the lead wire is inserted through the hole in the printed circuit board, it is mechanically held to some extent and supported so that the structural strength of the connection between the component in the board does not depend entirely upon the solder joint or connection between the lead wire and the conductor on the board. It is therefore desirable to use the circuit board holes for metallic boards.

An object of the present invention is to provide an improved method for mounting components on metallic printed circuit boards. A further object is to provide an improved mounting means adapted for use in a metallic printed circuit board which, in use, functions to provide an electrical connection between a component lead wire and a conductor on the board and at the same time electrically isolates the component lead wires from the metallic board itself.

These and other objects of the invention are achieved in a preferred embodiment thereof which is described briefly in the foregoing abstract, which is described in detail in the specification which follows, and which is shown in the accompanying drawings in which.

Figure 3:
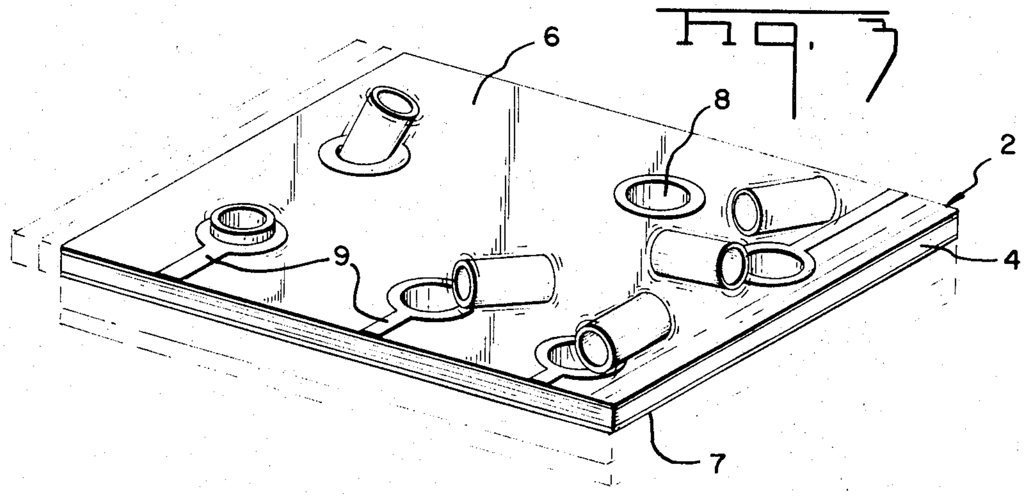
FIG. 3 is a perspective view illustrating the manner in which liners of the type shown in FIG. 2 are inserted into printed circuit board holes.
Figure 4:
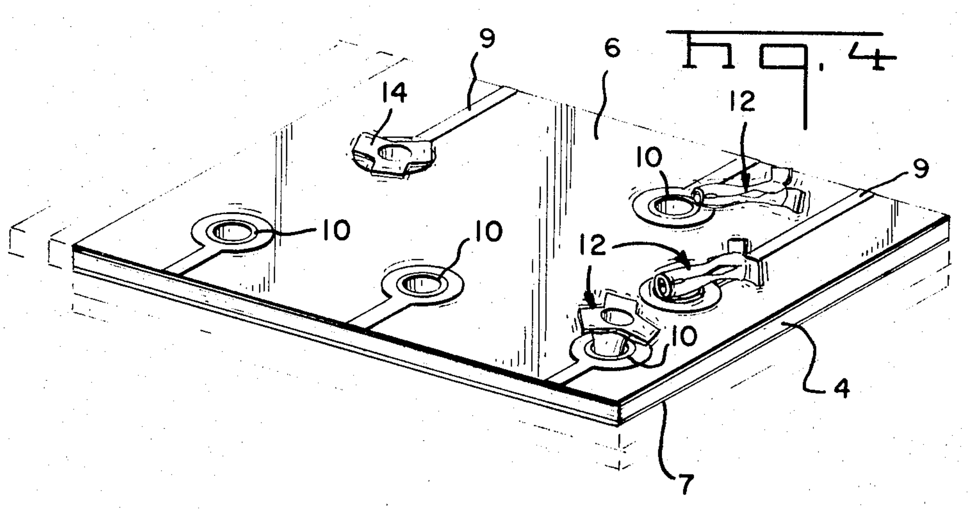
FIG. 4 is a perspective view illustrating assembly of the component receptacles to the previously lined holes in a printed circuit board.

Referring first to FIGS. 3 and 4, a conventional metallic printed circuit board 2 of the type known to the art comprises a relatively thin panel 4 of a suitable aluminum alloy having coatings 6, 7 on its faces or surface. Printed circuit boards of this type are receiving a favorable reception in certain sections of the electronics industry by virtue of their durability, their dimensional stability under the influence of fluctuating temperatures, the dimensional precision with which they can be made, and other advantages which are particularly attractive under some circumstances. Boards of this type are provided with conducting paths indicated at 9 as are conventional printed circuit boards and components mounted on the board must have their lead wires connected to these conducting paths. In the commercially available printed circuit boards of this type, the thickness of the aluminous panel is about 0.040 inches and the coatings, which are of cross-linked polyethylene, are each about 0.010 inches thick. Printed circuit boards of this type are available from American Enka Corporation, Brand-Rex Division of Willimantic, Conn.

Because of the fact the center portion 4 of the board is of metal, it is impossible to employ previously known techniques for forming an electrical connection between a component wire 26 and a conductor 9 on the board. If a wire 26 is merely inserted through the hole 6 in the board and soldered to effect a connection between a wire and the conductor 9, a connection will be effected between the wire and the metallic center panel 4 of the board.

In accordance with the principles of the instant invention, sleeves 10 are provided for each of the board holes 8 which have a length substantially equal to, but no greater than, the total thickness of the board and which have a diameter slightly less than the diameter of the board holes 8. The sleeves may be of any suitable plastic although a material having good high temperature properties such as Teflon (polytetrafluorethylene) is preferred. The sleeve is in the so-called heat unstable condition in that upon heating, its diameter increases. Heat unstable plastic materials of this type are commonly known to the art and are widely used for insulating electrical connections. Ordinarily, the sleeves used for insulating connections have a tendency to contract, that is to reduce their diameters, upon heating. The sleeve 10 of the instant invention however is processed in a manner such that it will expand upon heating to about 525° F. Expandable sleeves for the practice of the invention can be made by passing 0.065 inch O.D. Teflon tubing having a 0.006 inch wall thickness through a die having a 0.041 inch opening at room temperature. The tubing is then cut into sections of the desired length for the printed circuit boards. Sleeves manufactured in accordance with these steps can be used in a board having 0.052 inch diameter holes and will expand, upon heating, to a tight fit. As an alternative expandable cross linked polyethylene tubing can be used.

Referring to FIG. 3, the sleeve 10 may be inserted into each of the printed circuit board holes 8 by simply placing an excess of sleeves on the surface 6 of the board and vibrating the entire board until the random motions of the sleeve cause entry of one sleeve into each hole. Equipment for inserting small cylindrical parts into printed circuit board holes is now known to the art and is shown for example in the copending U.S. application of Willard L. Busler et al. Ser. No. 811,269, filed Feb. 12, 1969.

Figure 5:
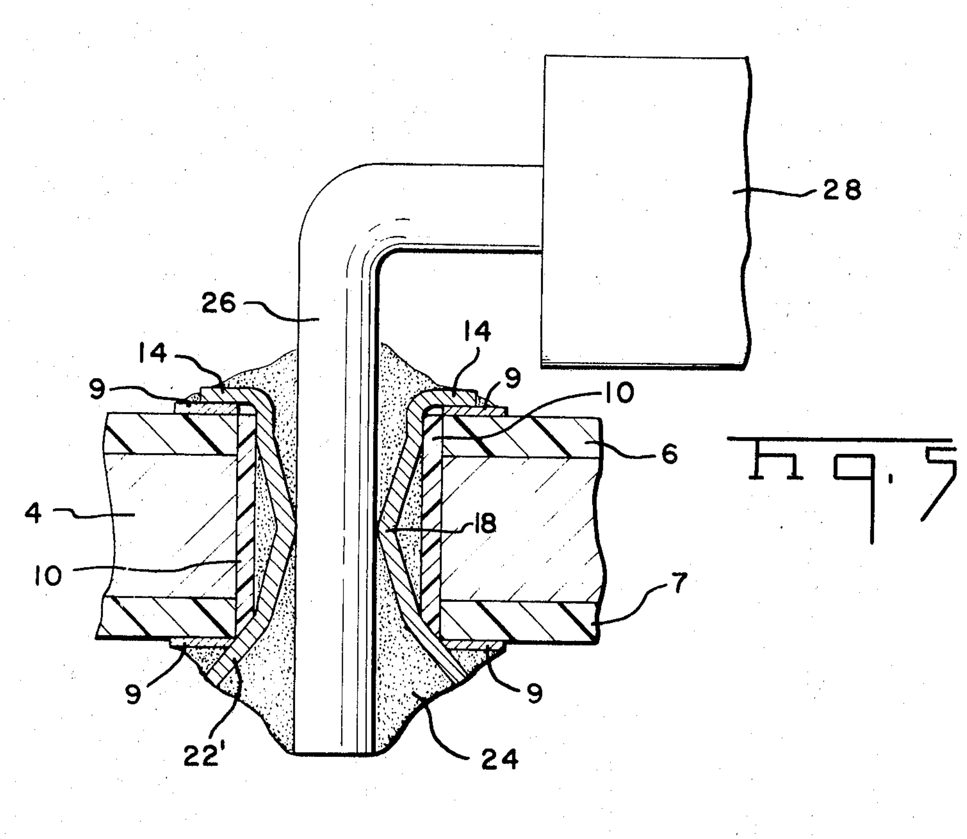
FIG. 5 is a fragmentary cross-sectional view, on an enlarged scale, showing a completed connection between a component wire and a conductor on a metallic printed circuit board in accordance with the invention.

After all of the holes 8 have been lined with the sleeves 10, the board is heated in a suitable oven to a temperature of about 525° F. to cause expansion of the sleeves and to bring about an intimate engagement of the surfaces of the sleeves with the exposed surfaces of the center panel 4 of the board as shown in FIG. 5. Extremely close engagement of the surface of each sleeve with the metallic surface of the hole in which it is mounted is highly desirable to facilitate the transfer of heat from the component wire 26 to the board thereby to achieve continuous dissipation of the heat generated in the components on the board, to take advantage of the board as a heat sink and radiator, and to electrically insulate the board from solder to be applied.

Figure 1:
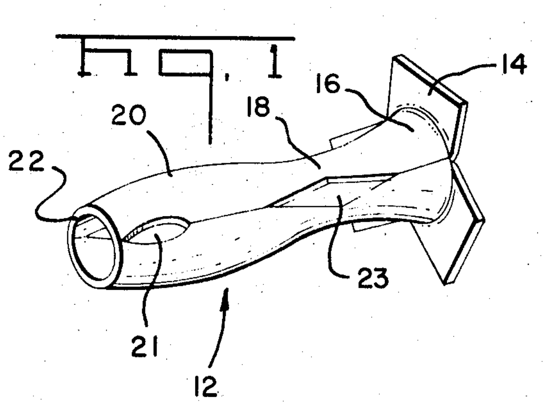
FIG. 1 is a perspective view of a metallic receptacle for a component conductor in accordance with the invention.
Figure 2:
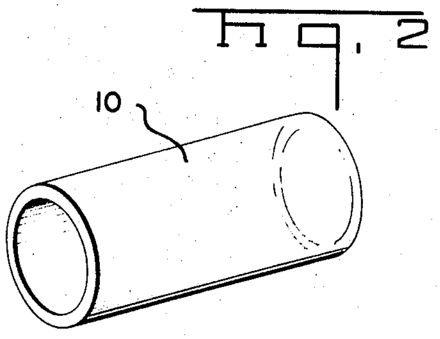
FIG. 2 is a perspective view of an insulating hole liner in accordance with the invention.

After the holes 8 have been lined with insulating sleeves, a component receptacle 12 is inserted into each hole as indicated in FIG. 4. Again, insertion can be achieved by vibration techniques although other means can be employed if desired as will be noted below. The component receptacle 12 of the disclosed embodiment of the invention is of stamped formed sheet metal having three laterally extending ears 14 at one end which function as stops preventing downward movement of the receptacles of FIG. 4 through the board holes. The body portion of the receptacle tapers inwardly adjacent to these ears as shown at 16 to a constricted neck 18 and then flares outwardly, in the manner of a bowling pin to an enlarged section 20. The left-hand end 22 of the receptacle as viewed in FIG. 1 tapers to a diameter which is somewhat smaller than the enlarged portion 20. After insertion of the receptacles into the board holes as illustrated in FIG. 4, the reduced lower ends 22 of the receptacles are flared outwardly as shown at 22' in FIG. 5 to retain the receptacles in the holes. It will be noted that the receptacle 12 is formed with three separate seams on opposite sides of the body portion, a feature which facilitates the flaring or spreading operation.

After flaring of the lower ends of the component receptacles, the individual components, as for example the resistor 28 of FIG. 5, are assembled to the board by simply inserting the lead wires 36 through the receptacles. The constricted center portion 18 of the receptacles will grasp the lead wires and temporarily hold the components in position while the board is being solder-dipped to form joints 24 between the component wires and the conductors on the the upper and lower sides 6, 7 of the board. It will be noted in FIG. 5 that solder completely fills the space between the component receptacle and additionally fills the spaces between the external surfaces of the receptacles and the exposed surface of the liner 10. To facilitate such wicking of the solder and the flow of solder to all of the space in the board hole, the receptacle is provided with suitable openings indicated at 21 and 23.

As will be apparent from FIG. 5, the solder which fills the entire board hole extends from the component wire 26 to the conductors on both sides of the board. The solder thus forms a direct electrical connection between the wires and the conductors with the component receptacle 12 functioning to stabilize the wires and prevent any relative movement between the wires and the solder which might endanger the electrical connections. The solder also extends continuously through the openings in the component receptacles to the inner walls of the sleeve 10 and functions to conduct heat from the component wires and therefore from the components to the center panel section 4 of the board. In this respect, it is desirable to use a relatively thin walled sleeve material which will be effective to electrically insulate the soldered connections from the center portion of the board but which will transmit a maximum amount of heat from the component wires to the board. Teflon in this respect is well suited as a liner material or sleeve material in that it has high dielectric strength in thin sections and will withstand the heat required for the soldering operation. As previously noted, the expansion of the sleeve 10 and the hole with extensive surface contact between the surface of the sleeve and the exposed metallic portions of the board. This close contact of the sleeve with the metallic portion of the board coupled with the extensive surface area provided results in the development of substantial heat transfer capacity so that supplementary heat sinks are not required.

Figure 6:
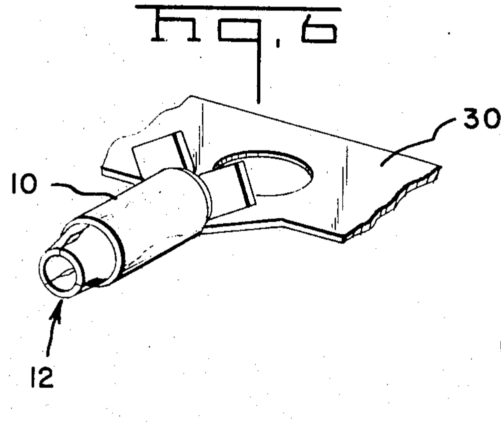
FIG. 6 is a perspective view of a short section receptacle strip in accordance with the invention.
Figure 7:
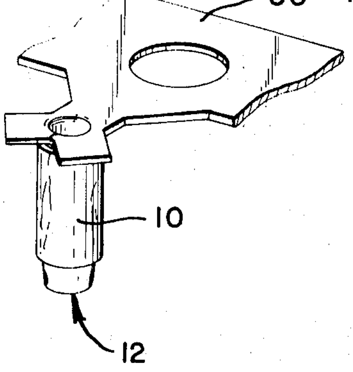
FIG. 7 is a view similar to FIG. 6 but showing an individual hole liner assembly bent through a right angle so that it extends normally of the strip preparatory to insertion of the liner into a hole in a printed circuit board.

In accordance with the embodiment of FIGS. 6 and 7, component receptacles 12 are manufactured in the form of continuous strip with the individual receptacles being integral with a conventional carrier strip 30. The sleeves 10 in accordance with this embodiment are merely mounted on the receptacles after the stamping and forming operations have been carried out and the sleeve-receptacle assembly is inserted directly into the board hole 8. It is preferable to manufacture the strip with the axes of the receptacles extending parallel to the plane of the carrier strip and the individual liner assemblies are then bent through a 90° angle as indicated in FIG. 7 immediately prior to severance from the carrier strip 30 and insertion into the board holes. Insertion may be carried out with suitable insertion equipment of the general type used for example for inserting specialized component receptacles or terminal posts into printed circuit boards.

Obvious modifications, within the scope of the invention will be apparent to those skilled in the art. For example, where the board 2 has an insulating coating on any one side, the sleeve 10 can be made with a length greater than the board thickness so that it will extend beyond the uninsulated side. The sleeve under such circumstances will function to electrically insulate the component conductor 26 and the receptacle from the uninsulated side of the board. It will also be apparent that the heat for expanding the sleeve 10 obtained from the soldering operation so that soldering and expansion of the sleeve take place simultaneously.

Changes in construction will occur to those skilled in the art and various apparently different modifications and embodiments may be made without departing from the scope of the invention. The matter set forth in the foregoing description and accompanying drawings is offered by way of illustration only.

I claim:

1. The method of forming an electrical connection between a first conductor extending from a component and a second conductor on a metallic printed circuit board, said board comprising a relatively thin metallic panel having a coating of insulating material on at least one of its surfaces, said board having a hole therein for reception of said first conductor, said method comprising the steps of:

inserting an expandable polymeric sleeve into said hole, the length of said sleeve being at least equal to the thickness of said panel and being no greater than the thickness of said board;

inserting a metallic receptacle into said sleeve, said receptacle having a length greater than the thickness of said boards;

securing said receptacle to said board by deformation of end portions of said receptacle so that said end portions engage said coating of said board;

inserting said first conductor into said receptacle; and filling said hole with solder whereby, said first conductor is electrically connected to said second conductor on said board and said panel forms a heat sink for said component by conductive transfer of heat from said component through said sleeve to said panel.

2. A method as set forth in claim 1 wherein said board has a multiplicity of holes, said method including the step of inserting sleeves into said holes by providing an excess of said sleeves on said board and vibrating said board.

3. A method as set forth in claim 1 wherein said board has a multiplicity of holes, said method including the step of inserting said sleeves into said holes by vibration.

4. A method as set forth in claim 1 wherein said board has a multiplicity of holes, said method including the steps of inserting said sleeves and said receptacles into said holes by vibration.

5. A method as set forth in claim 3 wherein said sleeves are heated subsequent to insertion into said board holes and prior to filling of said holes with solder.

6. A method as set forth in claim 1 wherein said sleeve is radially expanded by heating during soldering.

7. A device for mounting a component on a metallic printed circuit board comprising:

a metallic receptacle adapted to receive a conductor extending from said component;

a polymeric sleeve in surrounding relationship to said receptacle, said sleeve being in a dimensionally unstable condition and being radially expandable, said sleeve having an outside diameter which is less than the diameter of a hole in said printed circuit board and having expanded dimensions which provide a tight fit in said hole whereby;

upon insertion of said device into said hole and upon expansion of said sleeve, said receptacle is retained in said hole and is insulated from said boards.

8. A device as set forth in claim 7 wherein said sleeve is in a heat unstable condition and is radially expandable upon application of heat.

9. A device as set forth in claim 7 wherein said receptacle has a restricted intermediate portion for frictional engagement with said conductor extending from said component.

10. A device for mounting a component on a metallic printed circuit board, said board comprising a metallic panel having its surface portions coated with an insulting layer, said device comprising:

a generally tubular metallic receptacle adapted to receive a conductor extending from said component, said receptacle having a length which is greater than the thickness of said printed circuit board;

a polymeric sleeve in surrounding relationship to said receptacle, said sleeve having a length which is substantially equal to and no greater than, the thickness of said board, said sleeve having an initial diameter which is less than the diameter of a hole in said board, said sleeve being in a heat unstable condition and being radially expandable upon application of heat to a diameter which is at least equal to the diameter of said hole whereby; and upon insertion of said device into said hole and expansion of said sleeve, said sleeve electrically insulates said receptacle and a component wire received therein from said metallic panel.

11. An electrical connection between a metallic printed circuit board and a component mounted on said board, said printed circuit board comprising a relatively thin metallic panel having an insulating coating on its surfaces and having a board conductor on the coating of at least one surface, said connection comprising:

a hole extending through said board and through said board conductor;

a polymeric sleeve in said hole, said sleeve having a tight fit within said hole and being in intimate engagement with exposed edge portions of said panel;

a metallic receptacle in said sleeve, said receptacle extending beyond said one surface of said board;

a conductor extending from said component and into said receptacle; and solder in said hole extending to said board conductor, said solder filling substantially all of the space between said sleeve and said receptacle whereby, said solder functions as an electrical connection between said component conductor and said board conductor and functions as a heat transmission means for conducting heat from said component conductor to said sleeve, said sleeve functioning to transmit heat to said panel and said panel functioning as a heat sink for said component.